United States Patent [19]

Nelson et al.

[11] Patent Number: 5,668,493
[45] Date of Patent: Sep. 16, 1997

[54] CIRCUITS AND METHODS FOR INCREASING SWITCH TURN-OFF SPEED IN HIGH-SPEED SWITCHING REGULATOR DRIVE CIRCUITS

[75] Inventors: Carl T. Nelson, San Jose; Robert Essaff, Fremont, both of Calif.

[73] Assignee: Linear Technology Corporation, Milpitas, Calif.

[21] Appl. No.: 488,071

[22] Filed: Jun. 7, 1995

Related U.S. Application Data

[63] Continuation of Ser. No. 228,478, Apr. 15, 1994.

[51] Int. Cl.$^6$ ...................................... H03K 5/08
[52] U.S. Cl. ...................... 327/309; 327/108; 327/312
[58] Field of Search ..................... 326/17–20; 327/309, 327/312, 374, 375, 493, 504, 583, 108

[56] References Cited

U.S. PATENT DOCUMENTS

| | | | |
|---|---|---|---|
| 2,895,100 | 7/1959 | Filberich et al. | 321/11 |
| 4,538,078 | 8/1985 | Pfeifer | 307/592 |
| 4,688,157 | 8/1987 | Rischmueller | 327/583 |
| 4,755,741 | 7/1988 | Nelson | 323/289 |
| 4,823,070 | 4/1989 | Nelson | 323/285 |
| 4,947,055 | 8/1990 | Shekhawat et al. | 307/254 |
| 5,138,202 | 8/1992 | Shekhawat et al. | 307/570 |
| 5,361,008 | 11/1994 | Saijo | 327/309 |

OTHER PUBLICATIONS

"LT1070/LT1071: 5A and 2.5A High Efficiency Switching Regulators," *Linear Technology Data Sheet*, Linear Technology Corporation, Milpitas, California, Apr. 1989, pp. 1–12.

LT1074/LT1076: "Step–Down Switching Regulator," *Linear Technology Data Sheet*, Linear Technology Corporation, Milpitas, California, Jun. 1991, pp. 1–16.

LT1070 "Design Manual," *Linear Technology Application Note 19*, by C. Nelson, Linear Technology Corporation, Milpitas, California, Jun. 1986, pp. 1–76.

LT1074/LT1076 "Design Manual," *Linear Technology Application Note 44*, C. Nelson, Linear Technology Corporation, Milpitas, California, Sep. 1991, pp. 1–48.

D.L. Grundy et al. (Ferrant Ltd.), "Collector diffusion isolation packs many functions on a chip," *Electronics*, v. 45, No. 14, pp. 96–104, Jul. 3, 1972.

Bob Mammano, "Simplifying Converter Design with a new Integrated Regulating Pulse Width Modulator," vol. III of the Proceedings of Powercon 3: Third National Solid–State Power Conversion Conference, Jun. 1976.

*Primary Examiner*—Timothy P. Callahan
*Assistant Examiner*—Jeffrey Zweizig
*Attorney, Agent, or Firm*—Fish & Neave; Robert W. Morris; Matthew T. Byrne

[57] ABSTRACT

Circuits and methods are provided for increasing the turn-off switching speed of a high-speed integrated circuit, bipolar switching regulator. The regulator The circuit runs at megahertz frequencies, yet is efficient as previously available bipolar integrated circuit switching regulators operating at much lower frequencies. The increased speed switch turn-off circuitry prevents the switch from spending too much time in a high power state (which would slow the switch down), increases the stability of the switch as compared with previously known designs. In a preferred embodiment, the circuitry includes a PNP transistor and a diode-connected transistor with their base-emitter circuits coupled to form a loop with the base-emitter circuit of a NPN transistor and the base-collector circuit of the switch to limit the on state voltage of the switch and control its depth of saturation. A capacitor is connected across the diode-connected transistor to reduce instabilities due to ringing caused by delays in the feedback loop.

18 Claims, 3 Drawing Sheets

CIRCUITS AND METHODS FOR INCREASING SWITCH TURN-OFF SPEED IN HIGH-SPEED SWITCHING REGULATOR DRIVE CIRCUITS

CROSS-REFERENCE TO RELATED APPLICATION

This application is a continuation of U.S. patent application Ser. No. 08/228,478, filed Apr. 15, 1994.

The present invention relates to a circuits and methods for providing increased switch turn-off speed in a high-speed switching regulator. More particularly, the invention relates to circuits and methods preventing the switch in a high-speed, bipolar integrated circuit switching regulator from becoming too saturated which enables the regulator to switch at megahertz frequencies, yet operate at efficiencies comparable to or better than previously available bipolar switching regulators operating at much slower speeds.

BACKGROUND OF THE INVENTION

With battery powered portable computers on the rise, the demand for efficient DC-to-DC power conversion is increasing. Battery life is of paramount importance to portable systems. Other important considerations are reducing space, weight and cost.

Switching regulators have long been known as offering a means for converting battery voltage in portable systems to other voltages at high efficiencies. However, a problem with previously available bipolar integrated circuit regulators has been that the switch operates at relatively low frequencies (e.g., in the neighborhood of 100 kHz). These low frequencies, while enabling the circuitry to operate with reasonable efficiency, require the use of relatively large external inductors and other components to form the switching regulator. Previously available high-speed, bipolar switching regulators that use smaller external components have suffered from a problem of inefficiency, and thus consume too much battery power.

In view of the foregoing, it would be desirable to provide an improved integrated circuit, bipolar switching regulator that operates at high-frequencies, in order to reduce the space, weight and cost of external inductors and other components used with the regulator.

It would further be desirable to provide circuits and methods for increasing the turn-off switching speed of such an integrated circuit switching regulator that operates at high efficiency, in order to prolong battery life in portable systems.

SUMMARY OF THE INVENTION

In view of the foregoing, it is an object of the present invention to provide an improved integrated circuit, bipolar switching regulator that operates at high-frequencies, in order to reduce the space, weight and cost of external inductors and other components used with the regulator.

It is a further object of the present invention to provide circuits and methods for increasing the turn-off switching speed of such an integrated circuit switching regulator that operates at high efficiency, in order to prolong battery life in portable systems.

These, and other objects of the present invention, are accomplished by an improved integrated circuit, bipolar switching regulator circuit. The circuit can operate in the megahertz range, yet at efficiencies comparable to or better than switching regulators heretofore available that operated at much lower frequencies. Further circuitry is provided for an improved clamp that prevents the switch from operating too far in saturation (which would slow the switch down and reduce efficiency) increases the stability of the anti-saturation loop as compared with previously known designs.

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
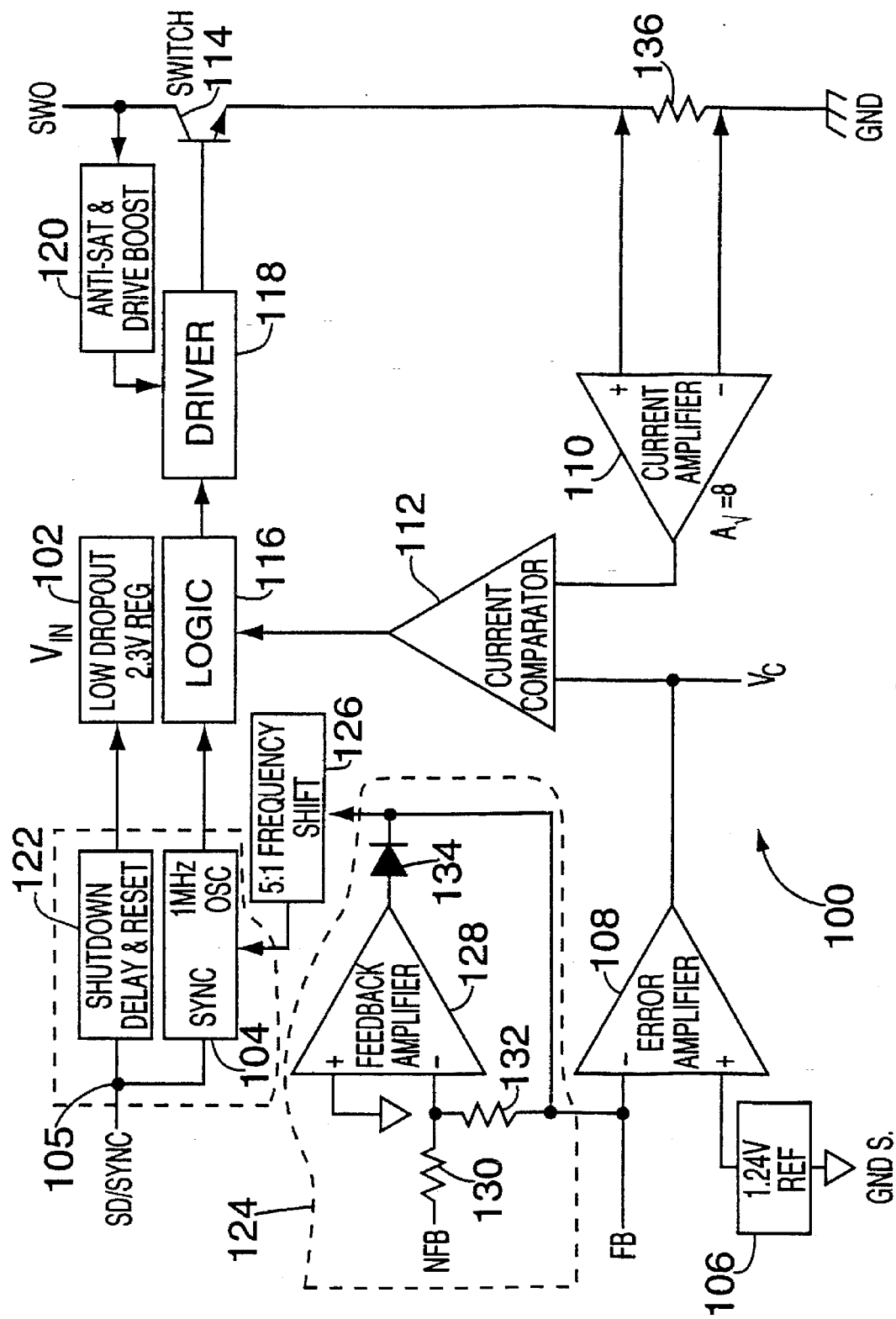
FIG. 1 is a schematic block diagram of a current mode switching regulator incorporating principles of the present invention.

FIG. 1 shows a schematic block diagram of a current mode switching regulator which incorporates the principles of the present invention. Although the principles of the invention are described with respect to a current mode regulator, it will be apparent to persons skilled in the art that many of the principles described below are equally applicable to other regulator circuits.

Switching regulator 100 may include a low dropout regulator 102, a trimmed oscillator 104, a trimmed reference voltage 106, an error amplifier 108, a current amplifier 110, a current comparator 112 to drive a switch 114. As is described below, in accordance with the principles of the present invention, regulator 100 also may include logic circuitry 116 and driver circuitry 118 to drive switch 114, as well as drive boost circuitry 120. Additionally, regulator 100 may include combined shutdown and synchronization circuitry 122, which utilizes a single input pin, a negative feedback regulation network 124 and an oscillator frequency shifting network 126. Negative feedback network 124 may include a feedback amplifier 128, resistor 130 and 132, and a means of blocking the output of the amplifier when its output goes low, shown in FIG. 1 as a simple diode 134. Current amplifier 110 measures the current passing through switch 114 by using a low value resistor 136 (e.g., 0.1ohms). The function of nodes $V_c$, SWO and $V_{IN}$ will also be apparent from the detailed discussion below.

Figure 2:
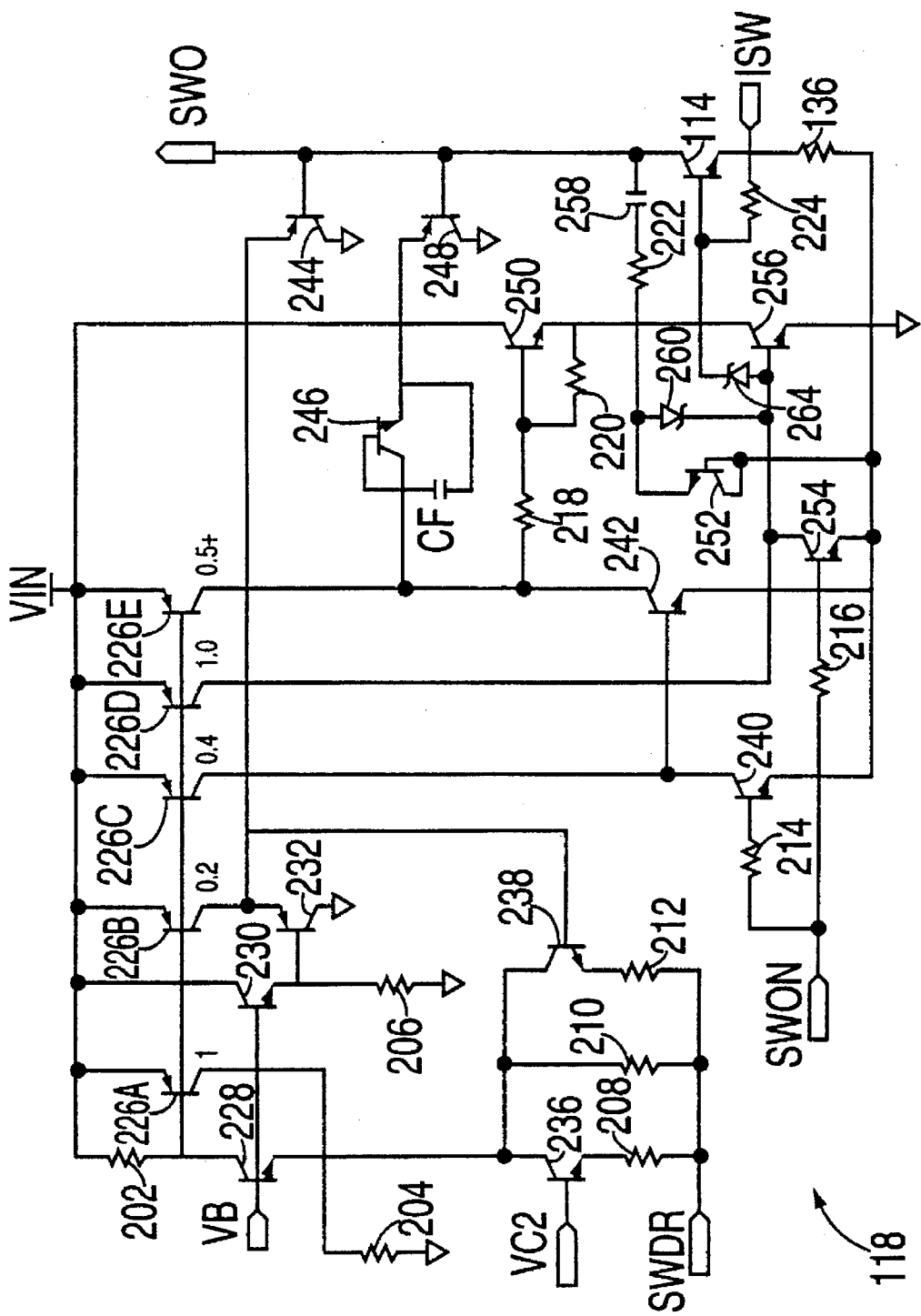
FIG. 2 is a schematic diagram of an exemplary embodiment of an integrated circuit switching regulator incorporating principles of the present invention.

FIG. 2 shows a detailed schematic diagram of an exemplary embodiment of the driver portion of an integrated circuit switching regulator incorporating principles of the present invention. The circuit is designed for coupling to a source of DC input voltage applied across terminals $V_{IN}$ and GND.

In the circuit of FIG. 2, the switch is comprised of power NPN transistor 114. Drive current for the switch is provided by PNP transistor 226E in combination with transistor 250. Terminal SWO is the switch output terminal for connection to an external load (not shown) that, in turn, is coupled to a source of electrical potential. This external load typically would include one or more current-steering diodes, an inductive element, and other components arranged in conventional fashion (e.g., in buck, flyback or boost configurations) to implement a complete switching regulator. Terminal ISW is a node where measurements of the current passing through switch 114 may be made (by using resistor 136). For example, when the circuit shown in FIG. 2 is used in a current mode switching regulator, the voltage across resistor 136 is used to determine when to shut off switch 114. The measured voltage is compared to a reference voltage which is set to represent the current shut-off point. When the measured voltage exceeds the reference voltage, the current trip point has been reached and switch 114, is shut-off (when the circuit has been shut down or a high impedance condition exists, resistor 224 prevents excess leakage current from inadvertently turning on switch 114).

Switch 114 is turned on and off by a signal, SWON ("SWitch ON"), via NPN transistors 240, 242, 254 and 256. When SWON is de-asserted (i.e., it is low), transistors 240 and 254 are off. This allows current provided by the collectors of PNP transistors 226C and 226D to drive the bases of transistors 242 and 256, turning those transistors on. (As further discussed below, transistors 226A–E form a controllable current source. Although shown as five separate transistors, persons skilled in the art will recognize that transistors 226A–E may be implemented instead, as in an actual embodiment of the circuit, as a single transistor 226 having multiple collectors A–E. In either case, transistor 226 is kept off during shutdown or high impedance conditions by resistor 202 which is connected to its base.) When transistor 242 is on, the base of transistor 250 is pulled low to turn that transistor off (transistor 250 is kept off by resistor 220). This prevents base drive from reaching transistor 114, and so the switch is off. As further discussed below, transistor 256 helps to turn and maintain switch 114 off (and diode 264 is used to increase the turn off speed of transistor 256).

When signal SWON is asserted high, the opposite occurs. Transistors 240 and 254 are turned on, causing the currents provided by the collectors of transistors 226C and 226D to be shunted to ground. The bases of transistors 240 and 254 are connected to ballast resistors 214 and 216, respectively, to prevent one saturated transistor from driving the other into saturation. Transistors 242 and 256, accordingly, are turned off. As a result, collector current from transistor 226E drives the base of transistor 250 through resistor 218 to turn that transistor on. Transistor 250 and PNP transistor 226E thus drive the base of switch 114 to turn the switch on.

The amount of current required from transistor 226E depends on whether switch 114 is conducting a large or small current. When the load on switch 114 is high, transistor 226E should preferably supply a relatively large current sufficient to cause the switch to turn on and to be driven to a desired operating point. The precise amount of drive current required to accomplish this will vary depending on the load on switch 114. Too much drive current is a waste of power and reduces efficiency. Too little drive current prevents the switch from turning on completely and would leave the switch in an undesirable high power dissipation state. When switch 114 is off, on the other hand, transistor 226E preferably should provide only a nominal or zero current. The circuit of FIG. 2 thus includes circuitry for reducing switch drive current during periods of time that switch 114 is off. This circuitry includes transistors 236, 238 and 228 as well as resistors 208, 210, 212 and 204, operating in conjunction with signal SWDR. The circuitry operates as follows.

When switch 114 is off (i.e., when signal SWON is low), signal SWDR ("SWitch DRive") is high. Thus, no current flows through transistor 236, resistor 210 or transistor 238.

To keep the PNP current source circuitry of transistors 226A–E biased, resistor 204 provides a path for a nominal current to flow through current-setting transistor 226A. NPN transistor 228, driven by reference voltage $V_B$ (which, in the exemplary circuit of FIG. 2, is preferably 2.2 volts), drives the base of transistor 226A until transistor 226A's collector current is sufficient to support the load (resistor 204) on transistor 226A's collector. Reference voltage $V_B$ may be generated by circuitry, not shown, in any of a number of conventional ways that will be readily apparent to those skilled in the art. For example, a bandgap reference circuit may be connected to an amplifier to adjust the bandgap reference voltage $V_{BG}$ (typically 1.24 volts) to the desired reference voltage (e.g., 2.2 volts). The voltage at the collector of transistor 226A thus is equal to the magnitude of $V_B$ (2.2 volts) minus the base-emitter voltage of transistor 228 (about 0.7 volts). The setting by resistor 204 of transistor 226A's nominal current sets the nominal currents provided by transistors 226B–E. This is because the collector currents of transistors 226B–E are related to the collector current of transistor 226A by the ratios of the areas of the transistors. As indicated in the exemplary circuit of FIG. 2, the ratios of the currents A:B:C:D:E of transistors 226A–E are 1×:0.2× :0.4×:1.6×:5×, respectively.

An aspect of the present invention that increases the speed at which transistor 114 switches off and improves efficiency is an improved clamp for defining the switch voltage in the "on" state. It is well known that the speed at which a transistor can turn off while operating near or in saturation is related to how far in saturation the transistor is operating. A transistor operating out of saturation, or in quasi-saturation, will turn off more quickly than will a more saturated one. For this reason, it is well known to use a Baker clamp to prevent a switch from becoming too saturated. Examples of previously used Baker clamp circuits may be found in U.S. Pat. No. 4,755,741 (see FIG. 6); "Collector Diffusion Isolation—A new Bipolar Process for Integrated Circuits," Ferranti Ltd, 2nd Edition, October 1972; and Bob Mammano, "Simplifying Converter Design with a new Integrated Regulating Pulse Width Modulator," Vol. III of the Proceedings of Powercon 3: Third National Solid-State Power Conversion Conference, June 1976.

However, traditional Baker clamps—because their operation relies on feedback—can cause instabilities in the circuit in the nature of ringing or oscillations. This ringing causes electromagnetic interference and may reduce efficiency of the regulator circuit.

An aspect of the present invention solves this problem in prior art Baker clamped switches by the circuitry shown in FIG. 2. The Baker clamp in FIG. 2 is comprised of PNP transistor 248 and diode-connected transistor 246. The base-emitter circuits of these components, when coupled as shown, form a loop with the base emitter circuit of transistor 250 and the base-collector circuit of transistor 114. The base-emitter voltages of transistors 246 and 248 are chosen (by area-ratioing) to limit the collector-emitter voltage of switch 114 in the on state. Transistors 246 and 248 become forward-biased—causing current to be shunted away from the base of transistor 250. Transistors 246 and 248 thus operate to limit the on state voltage of switch 114. When the collector-emitter voltage of switch 114 drops below a desired level, the feedback action of transistors 246 and 248 will cause the collector voltage of transistor 114 to drop just low enough to turn on both transistors 246 and 248. Hence, transistor 114's collector voltage is clamped, and the operating point of the switch is limited. This limiting function may be used, for example, to control the depth of saturation of the switch.

Figure 3:
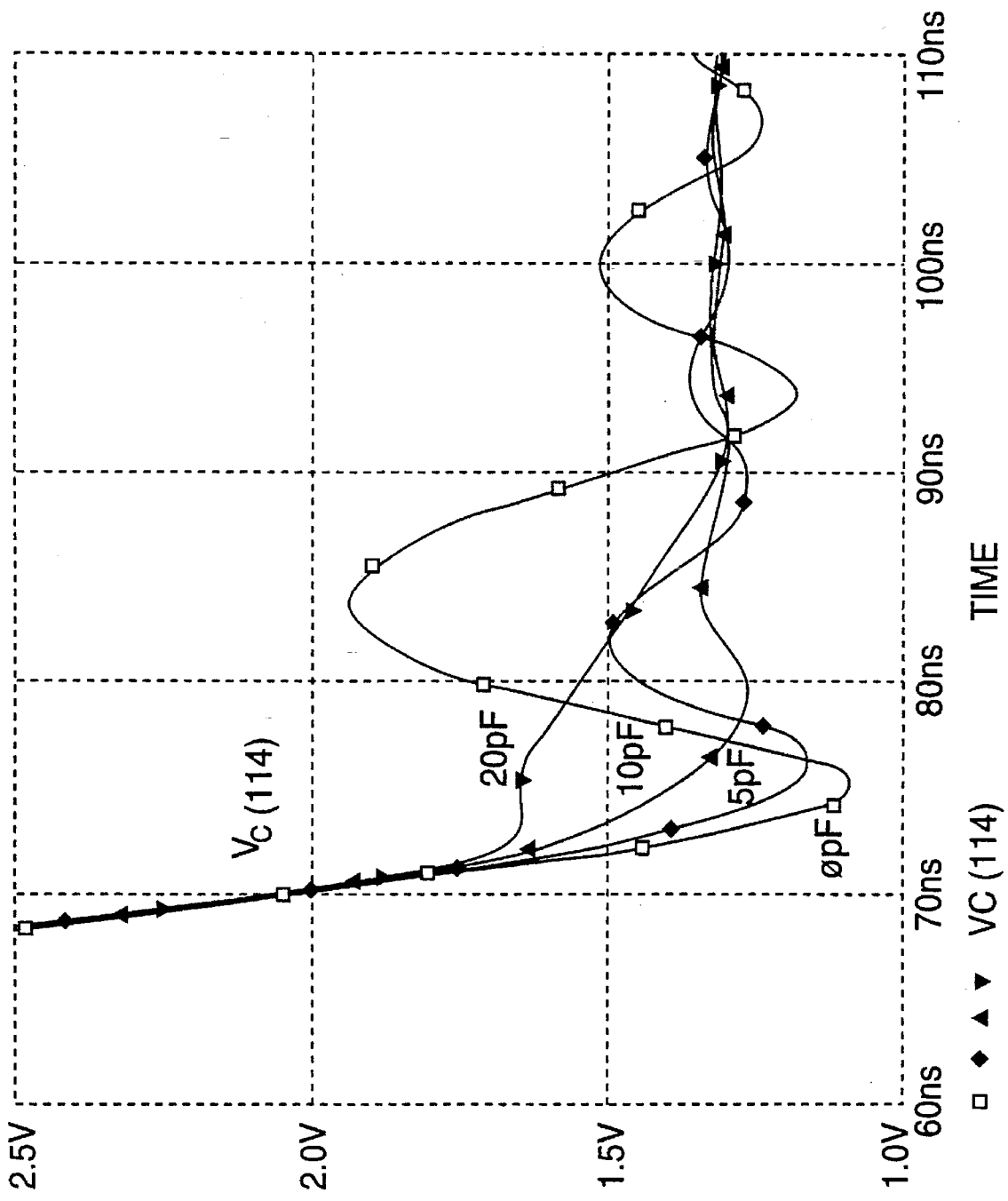
FIG. 3 is a graph plotting the voltage at the collector of the switch of FIG. 2 against time, and showing the increased stability of the switch clamp circuitry of the present invention.

A problem with the circuit of FIG. 2 to extent described so far is that, as mentioned, the Baker clamp is susceptible to instabilities. These instabilities are caused by delays in the feedback loop, a major cause of which is a significant delay associated with diode-connected transistor 246. The present invention solves this ringing problem by adding a capacitor, $C_F$, across diode-connected transistor 246 as shown in FIG. 2. The degree to which capacitor $C_F$ reduces ringing depends on the value chosen for the capacitor. FIG. 3 shows results that might be expected for different values of capacitor $C_F$ in the circuit of FIG. 1, but the effect of the capacitor in other circuits will vary based upon the selected operating region for the switch. For example, a slight improvement over the use of no capacitor at all results with a capacitance value of 5 pf (shown in FIG. 3 by the trace labelled "5 pf"). A value for capacitor $C_F$ of 10 pf provides a further improvement in stability as shown by the trace labelled "10 pf." On the other hand, a value of 20 pf for capacitor $C_F$ over-compensates the circuit, as shown in FIG. 3 by the trace labelled "20 pf." This over-compensation is undesirable, because it allows the switch to spend more time in a higher power state. The end result is that the switch, under certain conditions, switches more slowly, creating AC switching losses. In an actual embodiment of the circuit of FIG. 2, a value of about 15 pf for capacitor $C_F$ was found to give satisfactory results.

The circuits of FIGS. 1, and 2 can be implemented using commercially available components. For example, the circuits can be constructed and operated using the components and values set forth in Table 1, below (for the transistors, only transistor type and area ratio are given):

TABLE 1

| | |
|---|---|
| Capacitor $C_F$: | 15 picofarads |
| Capacitor 258: | 2 picofarads |
| Resistor 130: | 100K ohms |
| Resistor 132: | 50K ohms |
| Resistor 136: | 0.1 ohms |
| Resistor 202: | 25K ohms |
| Resistor 204: | 15K ohms |
| Resistor 206: | 30K ohms |
| Resistor 208: | 1.5K ohms |
| Resistor 210: | 5K ohms |
| Resistor 212, 216, 222 and 224: | 1K ohms |
| Resistor 214: | 4K ohms |
| Resistor 218: | 10 ohms |
| Resistor 220: | 10K ohms |
| Transistor 114: | NPN; 6000:1 |
| Transistors 226A, 232 and 244 | PNP; 1:1 |
| Transistor 226C: | PNP; 0.4:1 |
| Transistor 226D: | PNP; 1.6:1 |
| Transistor 226E | PNP; 5:1 |
| Transistor 228 and 246 | NPN; 2:1 |
| Transistor 230: | NPN: 1:1 |
| Transistors 236, 238 and 252 | NPN; 5:1 |
| Transistors 242 and 254 | NPN; 10:1 |
| Transistor 246: | NPN; 30:1 |
| Transistor 248: | PNP; 20:1 |
| Transistor 250: | NPN; 180:1 |
| Transistor 256: | NPN; 120:1 |

While preferred embodiments of the invention have been set forth for purposes of the disclosure, modification of these embodiments may occur to those skilled in the art. For example, while the circuits of the present invention have been disclosed in the context of a control circuit for a switching regulator, it will of course be understood by those skilled in the art that the invention may be employed in any type of circuit utilizing switching transistors. Persons skilled in the art will appreciate that the present invention can be practiced by other than the described embodiments, which are presented for purposes of illustration and not of limitation, and that the present invention is limited only by the claims which follow.

What is claimed is:

1. A circuit for controlling the speed at which a switch transistor turns off by limiting the depth of saturation of the switch transistor, the switch transistor having a base, an emitter, a collector, and a collector-emitter voltage, the circuit comprising:

first means coupled to the switch transistor for providing a feedback circuit which places a lower limit upon the collector-emitter voltage of the switch transistor by shunting current away from the base of the switch transistor so that the switch transistor does not become more saturated than a threshold level of saturation; and second means for reducing ringing in the first means, the ringing being caused by delays in the feedback circuit of the first means, the second means being coupled to the first means.

2. The circuit defined in claim 1, wherein the first means comprises:

a clamp transistor having an emitter and a base coupled to the collector of the switch transistor; and a clamp diode coupled to the clamp transistor.

3. The circuit defined in claim 2, wherein the clamp transistor is a PNP transistor having an emitter coupled to the clamp diode and a collector coupled to a source of low potential.

4. The circuit defined in claim 2, wherein the clamp diode is an NPN diode-connected transistor having an emitter coupled to the emitter of the clamp transistor.

5. The circuit defined in claim 4, wherein the source of low potential is substantially ground.

6. The circuit defined in claim 2, wherein the second means comprises a capacitor coupled across the clamp diode to reduce ringing in the circuit formed by the clamp transistor, the clamp diode, the switch and means for driving the switch.

7. The circuit defined in claim 6, wherein the clamp diode is a diode-connected transistor base, an emitter, and a collector, the base of the diode-connected transistor is coupled to the collector of the diode-connected transistor, and the capacitor is coupled between the collector and the emitter of the diode-connected transistor.

8. A circuit for controlling the speed at which a switch transistor turns off by limiting the depth of saturation of the switch transistor, the switch transistor having a base, an emitter, a collector, and a collector-emitter voltage, the circuit comprising:

a clamp transistor having a base coupled to the collector of the switch transistor;

a clamp diode coupled to the clamp transistor, the clamp transistor and clamp diode forming a feedback circuit and operating to place a lower limit on the collector-emitter voltage of the switch transistor by shunting current away from the base of the switch transistor so that the switch transistor does not become more saturated than a threshold level of saturation; and a capacitor coupled across the clamp diode to reduce ringing in the circuit formed by the clamp transistor and the clamp diode, the ringing being caused by delays in the feedback circuit.

9. The circuit of claim 7, wherein the clamp diode is a transistor connected to operate as a diode.

10. The circuit defined in claim 8, wherein the clamp transistor is a PNP transistor having an emitter coupled to the clamp diode and a collector coupled to a source of low potential.

11. The circuit defined in claim 10, wherein the source of low potential is substantially ground.

12. A method for reducing ringing in a circuit which limits the depth of saturation of a switch transistor in a regulator circuit, the switching transistor having a base an emitter, a collector, and a collector-emitter voltage, the method comprising the steps of:

providing a feedback circuit which places a lower limit on the collector-emitter, voltage of the switch transistor by shunting current away from the base of the switch transistor so that the switch transistor does not become more saturated than a threshold level of saturation, the feedback circuit propagating time delays into the regulator circuit and the time delays causing the ringing; and reducing the propagated time delays of the feedback circuit by providing a damping circuit coupled to the feedback circuit.

13. The method of claim 12, wherein the step of providing a feedback circuit comprises the steps of:

coupling a diode to a source of electrical potential which drives the switch transistor; and coupling a clamp transistor between the diode and the switch transistor, the clamp transistor having a base, an emitter, and a collector.

14. The method of claim 13, wherein the step of reducing the propagated time delays comprises the step providing a capacitor across the diode.

15. The method of claim 13, wherein the step of coupling a clamp transistor comprises the steps of:

coupling the base of the clamp transistor to the switch; and coupling one of the collector and emitter of the clamp transistor to the diode, while coupling the other of the collector and emitter to a source of low potential.

16. The method of claim 15, wherein the clamp transistor is a PNP transistor and the step of coupling one of the collector and emitter comprises:

coupling the emitter of the PNP transistor to the diode while coupling the collector of the PNP to the source of low potential, the source of low potential being substantially ground.

17. The method of claim 13, wherein the step of coupling a diode comprises the step of:

coupling a diode-connected transistor to the source of electrical potential, the diode-connected transistor having a base, an emitter, and a collector.

18. The method of claim 17, wherein the diode-connected transistor is an NPN transistor and the step of coupling a clamp transistor comprises the steps of:

coupling the emitter of the diode-connected transistor to the clamp transistor; and coupling the base of the clamp transistor to the switch transistor.

* * * * *